United States Patent
Galic et al.

(10) Patent No.: US 12,431,883 B2
(45) Date of Patent: Sep. 30, 2025

(54) PULSE WIDTH MODULATION SYSTEM PROVIDED WITH SYNCHRONIZED CONTROL BOARDS

(71) Applicant: ALSTOM Holdings, Saint-Ouen-sur-Seine (FR)

(72) Inventors: Johann Galic, Surahammar (SE); Magnus Bergman, Västerås (SE); Torbjörn Trostén, Västerås (SE); Mikael H. Johansson, Hallstahammar (SE)

(73) Assignee: ALSTOM Holdings, Saint-Ouen-sur-Seine (FR)

( * ) Notice: Subject to any disclaimer, the term of this patent is extended or adjusted under 35 U.S.C. 154(b) by 44 days.

(21) Appl. No.: 18/572,940

(22) PCT Filed: Jun. 15, 2022

(86) PCT No.: PCT/EP2022/066256
§ 371 (c)(1),
(2) Date: Dec. 21, 2023

(87) PCT Pub. No.: WO2022/268592
PCT Pub. Date: Dec. 29, 2022

(65) Prior Publication Data
US 2024/0297641 A1 Sep. 5, 2024

(30) Foreign Application Priority Data
Jun. 22, 2021 (SE) .................................... 2150796-7

(51) Int. Cl.
*H03K 7/08* (2006.01)
(52) U.S. Cl.
CPC .................................... *H03K 7/08* (2013.01)

(58) Field of Classification Search
CPC .... H03K 7/08; H02M 1/0041; H02M 1/0074; H02M 1/14; H02M 1/0043; H02M 7/53873; H03C 3/00
See application file for complete search history.

(56) References Cited

U.S. PATENT DOCUMENTS

| | | | |
|---|---|---|---|
| 7,977,817 | B2 | 7/2011 | Joos |
| 2009/0184742 | A1 | 7/2009 | Kris |

(Continued)

FOREIGN PATENT DOCUMENTS

| | | |
|---|---|---|
| CN | 112810226 A | 5/2021 |
| GB | 2470591 A | 12/2010 |
| WO | 2018087187 A1 | 5/2018 |

OTHER PUBLICATIONS

C. Alosa, et al., "Modular Multi-Three-Phase Electric Drives for Enhanced Reliability and Current Ripple Minimization," IECON 2019—45th Annual Conference of the IEEE Industrial Electronics Society, Lisbon, Portugal, 2019, pp. 7108-7114, doi: 10.1109/IECON. 2019.8927819. (Abstract only).

(Continued)

*Primary Examiner* — Jeffrey M Shin
(74) *Attorney, Agent, or Firm* — Renner, Otto, Boisselle & Sklar, LLP.

(57) ABSTRACT

A pulse width modulation system includes a plurality of module building blocks One control board is a master control board and others are slave control boards. Each slave control board determines a fictive master board timer based upon timer information received via a communication bus, and synchronizes the timer rate of a slave board timer to a timer rate of the master control board, or of an external timer rate. The timer information includes interlacing angle information defining an interlacing point for each of the control boards receiving the timer information. The interlacing angles are determined in relation to each other such that (Continued)

variation of a predetermined operation parameter, related to loads connected to pulse width modulated phase outputs of function modules, is minimized. At least two control boards, for which the interlacing angles are determined, are arranged to control function modules at different module building blocks.

16 Claims, 4 Drawing Sheets

(56) References Cited

U.S. PATENT DOCUMENTS

| | | | | |
|---|---|---|---|---|
| 2011/0280299 A1* | 11/2011 | O'Malley | ............ | H03K 5/1565 |
| | | | | 375/238 |
| 2014/0203756 A1* | 7/2014 | Kajiura | ................... | H02P 27/08 |
| | | | | 318/812 |

OTHER PUBLICATIONS

International Search Report and Written Opinion issued for priority International Application No. PCT/EP2022/066256, mailed Oct. 18, 2022.

* cited by examiner

PULSE WIDTH MODULATION SYSTEM PROVIDED WITH SYNCHRONIZED CONTROL BOARDS

This application is a national phase of International Application No. PCT/EP2022/066256 filed Jun. 15, 2022, which claims priority to Swedish Application No. 2150796-7 filed Jun. 22, 2021, each of which is hereby incorporated herein by reference in its entirety.

TECHNICAL FIELD

The present disclosure relates to a pulse width modulation system, and a method in a pulse width modulation system, and in particular to a system and method using so called soft synchronization between control modules for determining interlacing angles of loads connected to pulse width modulation phase outputs, particularly in railway applications.

BACKGROUND

Pulse width modulation (PWM) is a method of reducing the average power delivered by an electrical signal, by effectively chopping it up into discrete parts.

The pulse width modulation system according to the present invention is particularly applicable in silicon carbide (SiC)-equipped traction converters, and by applying SiC it may contribute towards more sustainable urban transit systems with lower energy consumption and noise levels. One purpose of the traction convertor is to convert DC voltage to a variable voltage and a variable frequency, e.g. adapted to the engines. A rapid and accurate control of the engine torque may thereby be achieved such that the train have a smooth movement.

The method to synchronize board timers and interlace PWM outputs is relevant e.g. to be able to reduce the size of a DC-link capacitor. This is beneficial for both SiC or Si based modules. It could become more important for SiC based inverters as they could be built smaller, due to reduced losses and then the relative size of the capacitor increases.

In a pulse width modulation system a number of racks are normally provided, each comprising a number of control boards. Each control board is configured to control a module building block that in turn is provided with a number of function modules. Each function module is configured to power and control a load using pulse width modulation. The load may e.g. be one or several traction motors connected in parallel; auxiliary transformers; brake chopper resistors; step-up or step-down choppers, and main transformer windings, for AC system with line converter. The various loads connected to the different module building blocks must be controlled and energized with respect to each other such that the power outtake is relatively even over time. Therefore is the synchronization of the timing applied by the different control boards used to control the functional modules of a rack very important.

The control boards are connected to each other by a communication bus, e.g. an inter converter serial bus (ICE-bus). Conventionally, so-called hard synchronization is applied which means that the clock rate and timer values of the control boards at the same rack are kept the same.

One disadvantage of applying hard synchronization is that the control boards have to be restarted in a certain order in order to get interrupts running.

More particularly, at the root of the problem is the interrupt handling. For hard synchronized timers, each control board needs to change its timer value to get in synchronization with the master board. However, changing the timer value cannot be done independently from the interrupt handling process. By instead using a so-called soft synchronization method, it will be possible to handle synchronization independently of the interrupt process.

As mentioned above, an important aspect of controlling various loads in railway systems is that power outtake of the DC link is relatively even over time. More specifically, if the loads connected to the phase outputs are e.g. brake choppers, too large capacitor voltage variations may have negative effect of the power outtake being even over time. Also, if the load connected to the phase outputs are e.g. voltage source converter, too large DC link ripples may be present.

Related background technology is disclosed in US-2009/0184742 that relates to externally synchronizing multiphase pulse width modulation signals.

The object of the present invention is to achieve an improved pulse width modulation system where the above disadvantages are removed, or at least mitigated, and particularly a system where the power outtake is more even over time.

SUMMARY

The above-mentioned objects are achieved by the present invention according to the independent claims.

Preferred embodiments are set forth in the dependent claims.

According to a first aspect, the present invention provides a pulse width modulation system comprising a plurality of module building blocks. Each building block is connected to and controlled by a control board, where each module building block comprises a set of function modules, provided with pulse width modulated phase outputs adapted to be connected to predetermined loads. Each module building block is connected to a direct current (DC) link, and that the control boards are connected to each other via a communication bus. One of the control boards is a master control board and the others are slave control boards. Each slave control board is configured to determine a fictive master board timer based upon timer information received via said communication bus, and is further configured to synchronize the timer rate of a slave board timer to a timer rate of the master control board, or of an external timer rate.

By fictive master board timer is meant a re-constructed master timer. The exact value of the master timer is not known, but through the fictive master board timer the value of the master timer is known sufficiently correct.

The timer information further comprises interlacing angle information defining an interlacing point for each of the control boards receiving the timer information. The interlacing angles of a plurality of control boards are determined in relation to each other such that the variation of at least one predetermined operation parameter, related to the loads connected to said pulse width modulated phase outputs of said function modules, is minimized.

In one variation, at least two control boards for which the interlacing angles are determined, are arranged to control function modules at different module building blocks. In another variation, the controlled function modules are at the same module building block.

Thereby is achieved an improved PWM system where the power outtake is more even over time in comparison to the presently used systems.

According to a second aspect, the present invention provides a method of the PWM system, where the method comprises:

determining, by each slave control board, a fictive master board timer based upon timer information received via said communication bus, synchronizing the timer rate of the slave board timer to the master timer rate or to an external timer rate.

The timer information further comprises interlacing angle information defining an interlacing point for each of the slave boards receiving the timer information, and the method further comprises:

determining the interlacing angles of a plurality of control boards in relation to each other such that the variation of at least one predetermined operation parameter related to the loads connected to said pulse width modulated phase outputs of said function modules is minimized.

In one variation, at least two control boards for which the interlacing angles are determined, are arranged to control function modules at different module building blocks. In another variation, the controlled function modules are at the same module building block.

According to one embodiment, loads, being e.g. brake choppers, controlled by different control modules are interlaced such that interlacing points are evenly separated in order to reduce oscillations of predetermined parameters, e.g. capacitor voltage variations.

Thus, one or many phase outputs connected to loads and from different modules are controlled such that interlacing points of loads connected to at least two different modules positioned in relation to an interlacing point generated by the master control board such that parameter oscillation in the system is kept at a low level, and reduced as much as possible.

By interlacing the pulse width modulated phase outputs for e.g. traction engines controlled by control boards it will, which is advantageous, be easier to comply with electromagnetic compatibility (EMC) requirements, and furthermore, it becomes possible to reduce the size of input filters.

DETAILED DESCRIPTION

The pulse width modulation system, and the method, will now be described in detail with references to the appended figures. Throughout the figures the same, or similar, items have the same reference signs. Moreover, the items and the figures are not necessarily to scale, emphasis instead being placed upon illustrating the principles of the invention.

Figure 3:
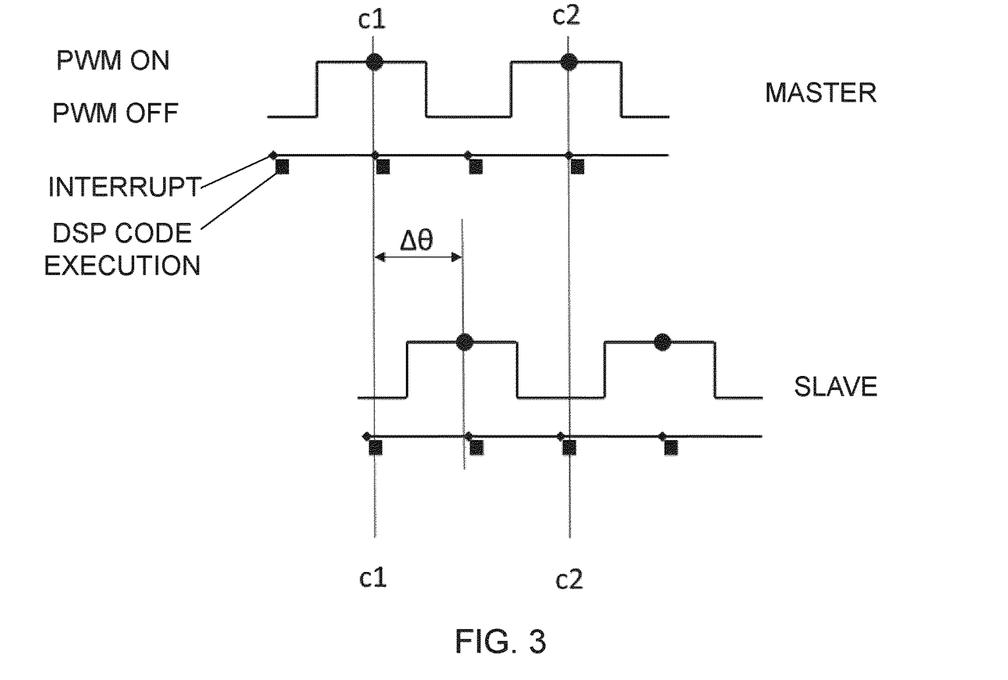
FIG. 3 illustrates a clock pulse applying hard synchronization.
Figure 4:
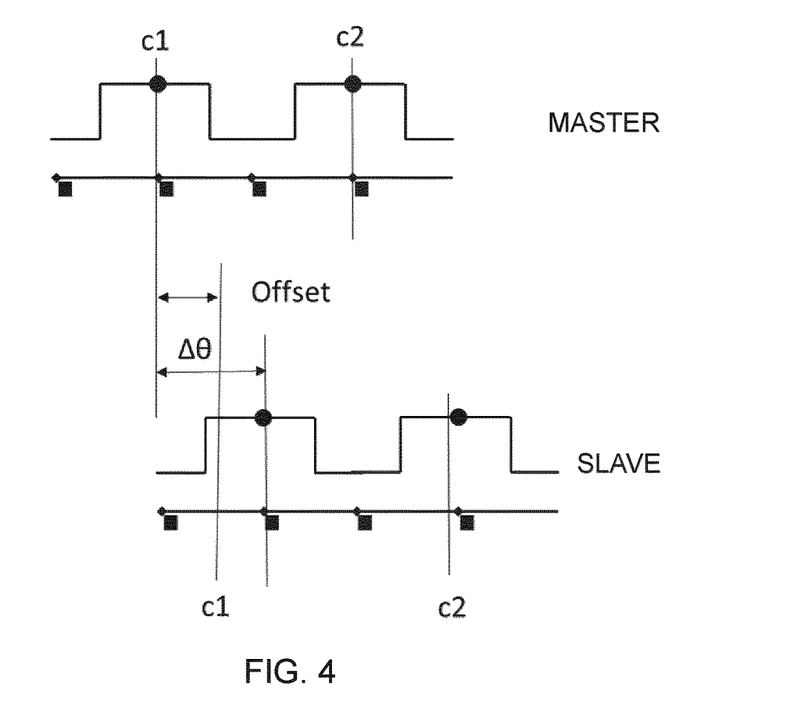
FIG. 4 illustrates a clock pulse applying soft synchronization.

FIGS. 3-6 show various pulse trains where $c1$-$c4$ designate points of time for interlacing points (also referred to as synchronization point), and $\theta$ designates an interlacing angle. FIG. 3 illustrates hard synchronized master and slave control board timers. Regardless of interrupt method, the control boards needs a method to synchronize clocks, so that the interlacing points happen correct in physical time. If the control board share the same timer and clock value then the boards are hard synchronized. For hard synchronized boards the interrupt (interlacing point) can be shifted for the slave board to achieve the desired interlacing angle $\theta$. In FIG. 3 is also shown the on and off of the PWM, the interrupts, and the digital signal processing code execution performed after each interrupt. FIG. 4 illustrates soft synchronized master and slave control board timers having different timers but having the same clock frequency.

In case the boards are soft synchronized, the clocks are controlled such that there exist a near constant offset between the control board timers.

Figure 5:
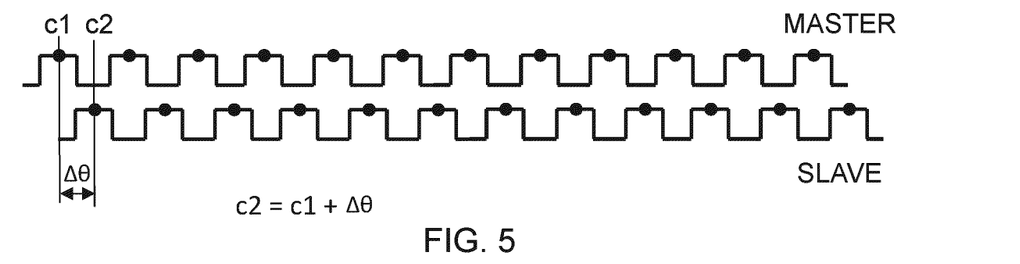
FIG. 5 illustrates clock pulses applying hard synchronization.

In FIG. 5 is illustrated a pulse train in a pulse width modulation system, where an interlacing point is illustrated for a master board timer and a slave board timer. The interlacing angle, denoted $\theta$, is also indicated. The interlacing angle is applied to define the timing between different connected loads.

The interlacing point is normally symmetrically located on the pulse, i.e. having essentially equal time length to the leading and lagging edge of the pulse. However, the position of the interlacing point may be freely chosen within the PWM period, positive or negative zero vector is preferable. The zero vector point is relatively shifted in time to achieve a certain harmonic spectrum, typically (2×pulse period)/(number of PWMs). One alternative is to run the interrupts in the middle of the pulse period and in this case the zero vector/interlacing point can coincide with the interrupt. The interlacing angles can then be controlled by controlling the interrupt points.

Another alternative is to use an oversampling task and let the interrupts run faster than the pulse period. In this case the zero vector/interlacing point needs to be controlled by the PWM controller.

Regardless of interrupt method, the control boards need a method to synchronize clocks, so that the interlacing points happen correct in physical time.

If the control board share the same timer and clock value then the boards are considered to be hard synchronized. For hard synchronized boards the, interrupt, (interlacing point) can be shifted for the slave board to achieve the desired interlacing angle $\theta$.

For hard synchronized clocks, time and clock is same on all boards. Hard synchronized pulse trains for a master and slave timer are illustrated in FIG. 5.

Figure 6:
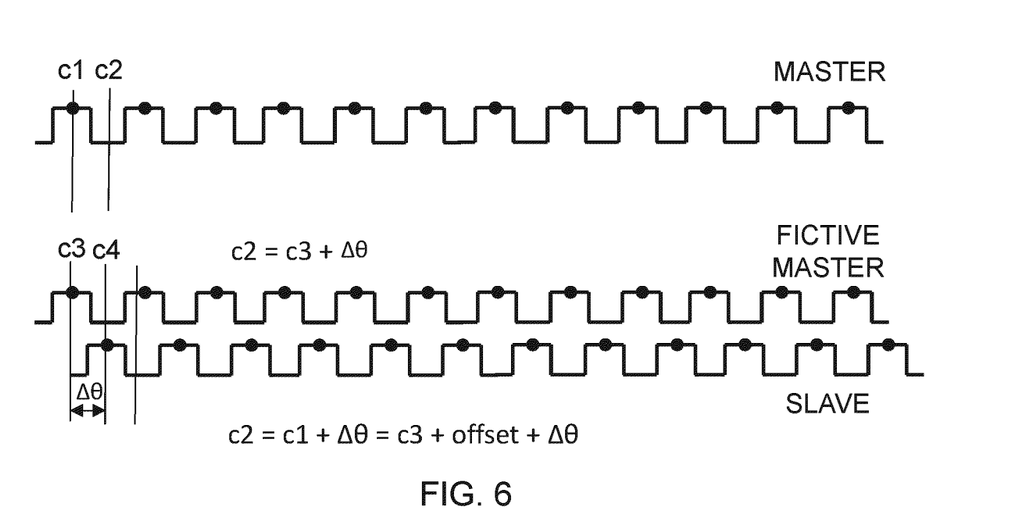
FIG. 6 illustrates clock pulses applying soft synchronization.

If the control boards have different timers, i.e. each control board has its own timer, but have the same clock frequency, the boards are considered to be soft synchronized. This is illustrated in FIG. 6. As mentioned above, the present invention relates to soft synchronized control board timers. Relationships between the timing of interlacing points $c1$-$c4$, the offset, and the interlacing angle $\theta$ are shown in FIG. 6.

Figure 1:
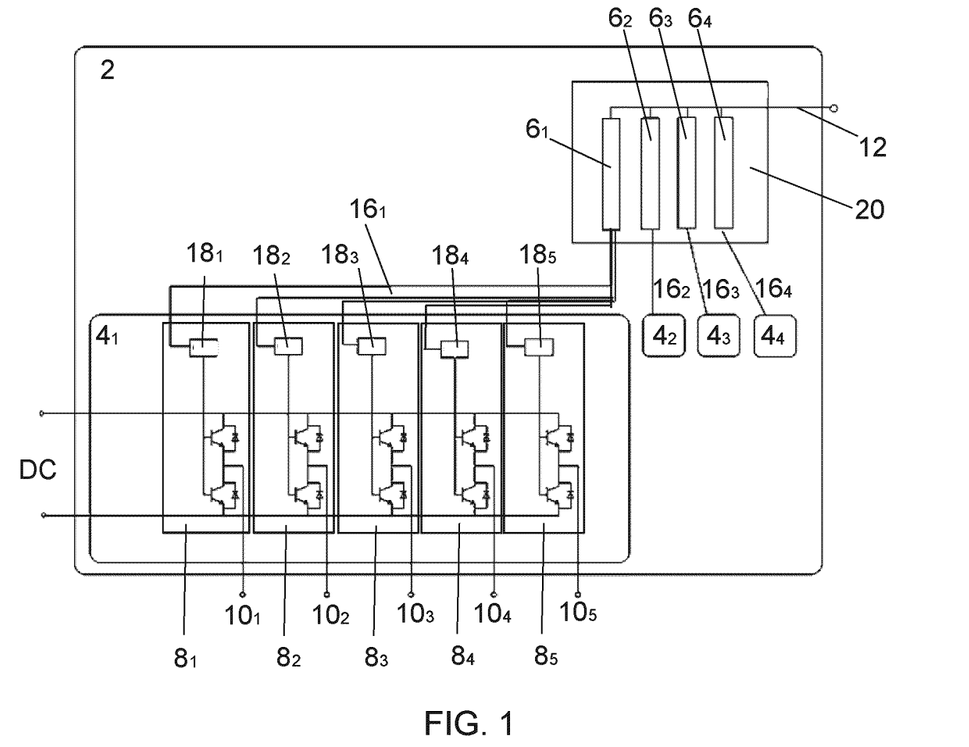
FIG. 1 is a block diagram schematically illustrating the pulse width modulation system according to the present invention.
Figure 2:
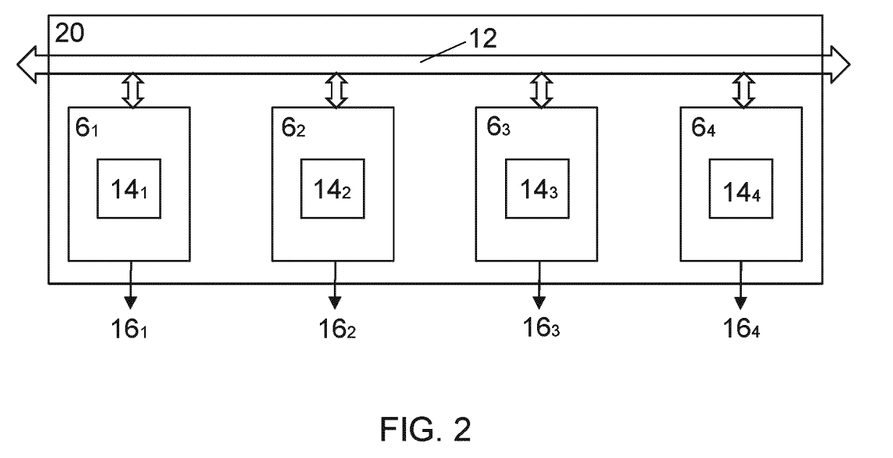
FIG. 2 is a block diagram schematically illustrating a rack including control boards according to the present invention.

Now with references to the block diagrams of FIGS. 1 and 2, a pulse width modulation system 2 comprising a plurality of module building blocks $4_1$-$4_4$ is provided. The number of module building blocks is in the disclosed example four, but may naturally be higher or lower.

Each building block is connected to and controlled by a control board $6_1$-$6_4$, and each module building block comprises a set of function modules $8_1$-$8_5$, provided with pulse width modulated phase outputs $10_1$-$10_5$ adapted to be connected to predetermined loads. The control boards $6_1$-$6_4$ are preferably located in a rack 20.

A single control board thus controls a configurable number of function modules in one module building block, depending on the application.

The loads connected to the function modules may be one or many of the following: one or several traction motors connected in parallel; an auxiliary transformer; a brake chopper resistor; a step-up chopper, and a main transformer winding, for AC system with line converter.

Furthermore, each module building block $4_1$-$4_4$ is connected to a direct current (DC) link. The control boards $6_1$-$6_4$ are connected to each other via a communication bus 12, preferably an inter converter serial bus (ICE-bus), or an Internet Protocol (IP) communication bus.

In an exemplary setup, the pulse width modulation system 2 comprises four module building blocks-three for a motor converter and one for a brake chopper. The latter has the task of taking care of the energy from braking motors in cases where the energy cannot be supplied back to the line voltage.

The control boards use a pulse width modulation method to control the pulse width modulated phase outputs $10_1$-$10_5$, i.e. the output of each of the function modules in a module building block. Depending on the application and type of PWM method, it is desirable to control the phase of the harmonics in relation to the other control boards connected to the same communication bus.

One of the control boards is a master control board $6_1$ and the others are slave control boards $6_2$, $6_3$, $6_4$. The roles of the control boards may vary over time, i.e. one of the slave control boards may take the role as master control board.

The master control board $6_1$ comprises a master board timer $14_1$ (see FIG. 2) configured to generate a clock signal having a master timer rate, wherein each of the slave control boards $6_2$, $6_3$, $6_4$ comprises a slave board timer $14_2$, $14_3$, $14_4$. As an alternative, the timer rate may be generated by an external control unit.

Each slave control board $6_2$, $6_3$, $6_4$ is configured to determine a fictive master board timer based upon timer information received via the communication bus 12. The timer information may be received from the master board timer 141, or from an external control unit.

The slave control board is further configured to synchronize the timer rate of the slave board timer ($14_2$, $14_3$, $14_4$) to a timer rate of the master control board, or of the external control unit.

The timer information further comprises interlacing angle information defining an interlacing point for each of the control boards receiving the timer information. The interlacing angles of a plurality of control boards are determined in relation to each other such that the variation of at least one predetermined operation parameter, related to the loads connected to the pulse width modulated phase outputs of the function modules, is minimized.

In one variation, at least two control boards for which the interlacing angles are determined, are arranged to control function modules at different module building blocks.

In another variation, the controlled function modules are at the same module building block.

Thus, the interlacing angles of the control boards are determined such that the variation of the predetermined operation parameter is minimized. The variation may relate to a variation of frequency, a variation of amplitude, and/or a variation of another measure of the operation parameter.

According to one embodiment, the interlacing angles are determined, by the master control board or by an external control unit, to control one type of load such that the interlacing angles designated to said one type of load are evenly spread out between 0-360 degrees. As an example, if the number of loads of the same type is three, then the interlacing angles of the respective loads are 0, 120 and 240 degrees.

According to an embodiment, the predetermined operation parameter to be minimized is a capacitor voltage variation (ripple) and input filter current of a load, e.g. a step up/down chopper, or a brake chopper. The applied interlacing scheme is to interlace the phases in relation to other phases.

According to another embodiment, the operation parameter to be minimized is a DC-link voltage ripple of a one and/or three phase load, e.g. a voltage source converter, a machine converter, an AC converter, etc.

In the following, some examples of loads and interlacing schemes will be discussed.

For motors, the applied interlacing scheme is to interlace the three phases in relation to three phases of other loads, for minimizing DC-link capacitor ripple and input filter current.

For secondary taps on a main transformer, the applied interlacing scheme is to interlace the single phase secondary windings in relation to other loads, for minimizing secondary and primary side line current harmonics.

For primary side of an auxiliary transformer, the applied interlacing scheme is to interlace the three phases in relation to three phases of other load, for minimizing voltage harmonics of the secondary side.

In one embodiment the master control board $6_1$ comprises a master board timer $14_1$ configured to generate a clock signal having a master timer rate, wherein each of the slave control boards $6_2$, $6_3$, $6_4$ comprises a slave board timer $14_2$, $14_3$, $14_4$.

In another variation of the system, the clock signal instead is generated by an external clock provided in an external control unit, and provided to the control boards via the communication bus using an internet protocol (IP).

The communication bus 12 is preferably an inter converter serial bus (ICE-bus), or an internet protocol (IP) bus.

In a further embodiment, the timer information also comprises timer offset information defining a time offset between the master board timer $14_1$ and each of the slave board timer $14_2$, $14_3$, $14_4$. Each of the slave control board $6_2$, $6_3$, $6_4$ is then configured to apply the received time offset in the control of the pulse width modulated phase outputs $10_1$-$10_5$, such that the position of a slave pulse width modulated phase output signal is controlled in relation to the fictive master board timer.

According to one embodiment, the slave board timers $14_2$, $14_3$, $14_4$ are configured to continue running independently if the master board timer $14_1$ is running or not, using the lastly received master timer rate and timer offset, and to resynchronize to the master timer rate, and to update the timer offset, when the master board timer $14_1$ restarts, or changes.

In a further variation of the PWM system, each control board $6_1$-$6_4$ is configured to control the set of function modules $8_1$-$8_5$ being e.g. IGBT or MOSFET modules, in the module building block $4_1$-$4_4$ using an optical protocol communication line $16_1$-$16_5$ and applying a gate drive unit $18_1$-$18_5$ for each module in the module building block $4_1$-$4_4$.

In one exemplary function module it comprises two SiC-MOSFETs and two SiC-Schottky diodes that handle 1700 V and 2×900 A. They work in pairs, an upper and a lower, which together form a phase leg. When one leads, the other is off and vice versa. This is how you can control the power to e.g. the motors. The switching frequency may be several kHz.

The present invention also relates to a method in a pulse width modulation (PWM) system 2 comprising a plurality of module building blocks $4_1$-$4_4$. The PWM system has been described in detail above and it is herein referred to that description.

Thus, each building block is connected to and controlled by a control board $6_1$-$6_4$, each module building block comprises a set of function modules $8_1$-$8_5$, provided with pulse width modulated phase outputs $10_1$-$10_5$ adapted to be connected to predetermined loads. Furthermore, each module building block $4_1$-$4_4$ is connected to a direct current (DC) link, and that the control boards $6_1$-$6_4$ are connected to each other via a communication bus 12, where one of the control boards is a master control board $6_1$ and the others are slave control boards $6_2$, $6_3$, $6_4$. As mentioned above, the roles of the control boards may vary.

Figure 7:
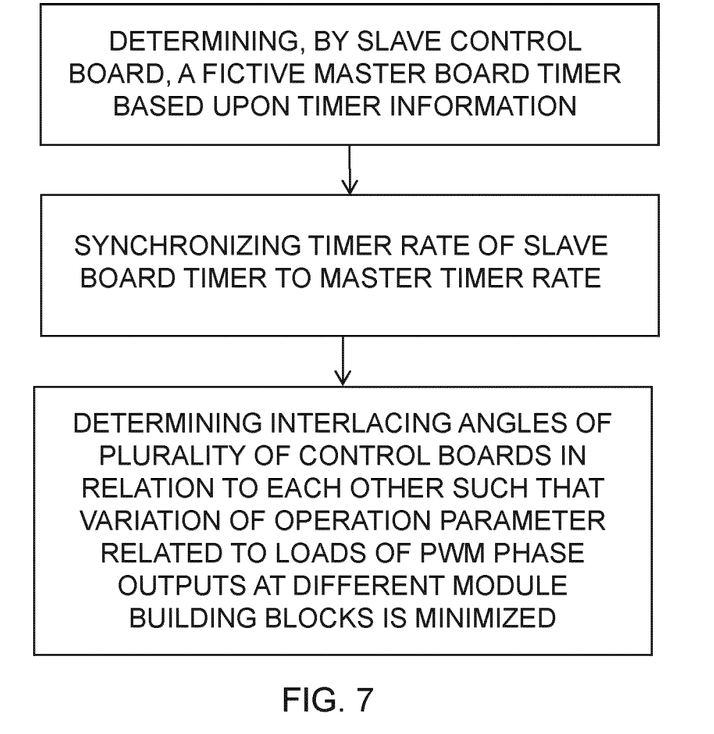
FIG. 7 is a flow diagram of the method according to the present invention.

The method will now be discussed in detail with references to the flow diagram shown in FIG. 7. The method comprises:
determining, by each slave control board $6_2$, $6_3$, $6_4$, a fictive master board timer based upon timer information received via the communication bus 12,
synchronizing the timer rate of the slave board timer $14_2$, $14_3$, $14_4$ to the master timer rate, or to an external timer rate.

The timer information further comprises interlacing angle information defining an interlacing point for each of the slave boards receiving the timer information. The method further comprises:
determining the interlacing angles of a plurality of control boards in relation to each other such that the variation of at least one predetermined operation parameter related to the loads connected to said pulse width modulated phase outputs of said function modules is minimized.

In one variation, at least two control boards for which the interlacing angles are determined, are arranged to control function modules at different module building blocks.

In another variation, the controlled function modules are at the same module building block.

According to a further embodiment, the method comprises determining the interlacing angles of slave control boards configured to control one type of load such that the interlacing angles designated to the one type of load are evenly spread out between 0-360 degrees.

In one embodiment, the predetermined operation parameter is a capacitor voltage variation of a load, being e.g. a step up/down chopper.

According to another embodiment, the predetermined operation parameter is a DC-link voltage ripple of a one or three phase load, being e.g. a voltage source inverter.

In another embodiment, the timer information also comprises timer offset information defining a time offset between the master board timer $14_1$ and the slave board timer $14_2$, $14_3$, $14_4$.

Figure 8:
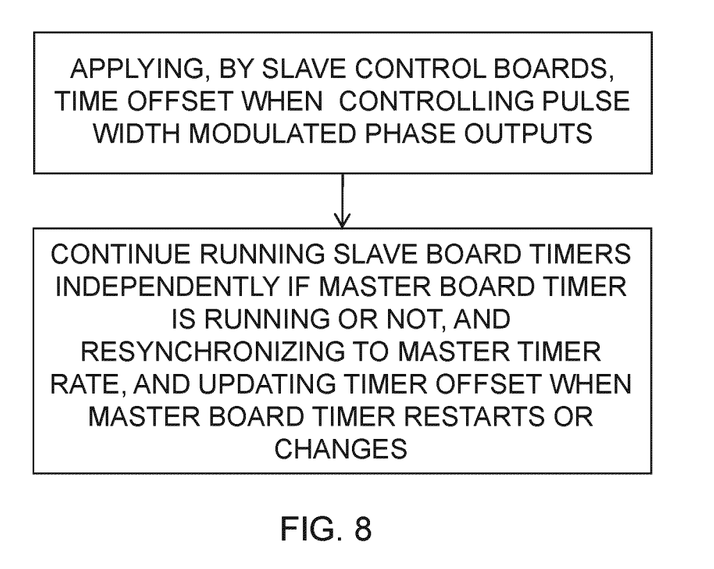
FIG. 8 is a flow diagram of the method according to an embodiment of the present invention.

With references to the flow diagram of FIG. 8, the method further comprises applying, by each slave control boards $6_2$, $6_3$, $6_4$ the time offset when controlling the pulse width modulated phase outputs $10_1$-$10_5$, such that the position of a slave pulse width modulated phase output signal is controlled in relation to the fictive master board timer.

According to a further embodiment, also illustrated by the flow diagram of FIG. 8, the method comprises continue running the slave board timers $14_2$, $14_3$, $14_4$ independently if the master board timer $14_1$ is running or not, using the lastly received master timer rate and timer offset, and resynchronizing to the master timer rate, and updating the timer offset, when the master board timer $14_1$ restarts, or changes.

The present invention also relates to a rail-bound vehicle comprising one or many pulse width modulation systems as described above.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A pulse width modulation (PWM) system comprising a plurality of module building blocks, wherein each module building block is connected to and controlled by a control board, each module building block comprises a set of function modules, provided with pulse width modulated phase outputs adapted to be connected to predetermined loads, and wherein each module building block is connected to a direct current (DC) link, and that the control boards are connected to each other via a communication bus, one of the control boards is a master control board and the others are slave control boards,
wherein each slave control board is configured to determine a fictive master board timer based upon timer information received from the master control board via said communication bus, and is further configured to synchronize the timer rate of a slave board timer to a timer rate of the master control board, or of an external timer rate, such that said slave board timer then is said fictive master board timer, and that said timer information further comprises interlacing angle information defining an interlacing point for each of the slave control boards receiving the timer information,
wherein the interlacing angles of a plurality of control boards are determined in relation to each other such that the variation of at least one predetermined operation parameter, related to the loads connected to said pulse width modulated phase outputs of said function modules, is minimized,
wherein said timer information further comprises timer offset information defining a time offset between the master board timer and the slave board timer, and
wherein said slave control board is configured to apply said time offset in the control of the pulse width modulated phase outputs such that the position of a slave pulse width modulated phase output signal is controlled in relation to the fictive master board timer.

2. The system according to claim 1, wherein at least two control boards, for which the interlacing angles are determined, are arranged to control function modules at different module building blocks.

3. The system according to claim 1, wherein the interlacing angles are determined, by said master control board or by an external control unit, to control one type of load such that the interlacing angles designated to said one type of load are evenly spread out between 0-360 degrees.

4. The system according to claim 1, wherein said predetermined operation parameter is a capacitor voltage variation of a load, e.g. a step up/down chopper.

5. The system according to claim 1, wherein said predetermined operation parameter is a DC-link voltage ripple of a one and/or three phase load, e.g. a voltage source converter.

6. The system according to claim 1, wherein the master control board comprises a master board timer configured to generate a clock signal having a master timer rate, wherein each of the slave control boards comprises a slave board timer.

7. The system according to claim 1, wherein said slave board timers are configured to continue running independently if the master board timer is running or not, using the lastly received master timer rate and timer offset, and to resynchronize to the master timer rate, and to update the timer offset, when the master board timer restarts, or changes.

8. The system according to claim 1, wherein said communication bus is an inter converter serial bus (ICE-bus).

9. The system according to claim 1, wherein said communication bus is internet protocol (IP) bus.

10. The method according to claim 1, comprising continue running said slave board timers independently if the master board timer is running or not, using the lastly received master timer rate and timer offset, and resynchronizing to the master timer rate, and updating the timer offset, when the master board timer restarts, or changes.

11. A rail-bound vehicle comprising one or many pulse width modulation systems according to claim 1.

12. A method in a pulse width modulation (PWM) system comprising a plurality of module building blocks, wherein each module building block is connected to and controlled by a control board, each module building block comprises a set of function modules, provided with pulse width modulated phase outputs adapted to be connected to predetermined loads, and wherein each module building block is connected to a direct current (DC) link, and that the control boards are connected to each other via a communication bus, one of the control boards is a master control board and the others are slave control boards, wherein the method comprises:

determining, by each slave control board, a fictive master board timer based upon timer information received from the master control board via said communication bus, synchronizing the timer rate of the slave board timer to the master timer rate or to an external timer rate, such that said slave board timer matches with said fictive master board timer, wherein said timer information further comprises interlacing angle information defining an interlacing point for each of the slave control boards receiving the timer information, and the method further comprises:

determining the interlacing angles of a plurality of control boards in relation to each other such that the variation of at least one predetermined operation parameter related to the loads connected to said pulse width modulated phase outputs of said function modules is minimized, wherein said timer information further comprises timer offset information defining a time offset between the master board timer and the slave board timer, the method further comprises:

applying, by each of the slave control boards, said time offset when controlling the pulse width modulated phase outputs, such that the position of a slave pulse width modulated phase output signal is controlled in relation to the fictive master board timer.

13. The method according to claim 12, wherein at least two control boards for which the interlacing angles are determined are arranged to control function modules at different module building blocks.

14. The method according to claim 12, comprising determining the interlacing angles of slave control boards configured to control one type of load such that the interlacing angles designated to said one type of load are evenly spread out between 0-360 degrees.

15. The method according to claim 12, wherein said predetermined operation parameter is a capacitor voltage variation of a load, being e.g. a step up/down chopper.

16. The method according to claim 12, wherein said predetermined operation parameter is a DC-link voltage ripple of a one or three phase load, being e.g. a voltage source inverter.

* * * * *